United States Patent
Lee et al.

(10) Patent No.: US 12,309,911 B2
(45) Date of Patent: May 20, 2025

(54) PRINTED CIRCUIT BOARD (PCB) COOLING

(71) Applicant: Hamilton Sundstrand Corporation, Charlotte, NC (US)

(72) Inventors: Yongduk Lee, Vernon, CT (US); Parag M. Kshirsagar, South Windsor, CT (US); Ankit Gupta, Willimantic, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 185 days.

(21) Appl. No.: 17/861,584

(22) Filed: Jul. 11, 2022

(65) Prior Publication Data

US 2024/0015881 A1    Jan. 11, 2024

(51) Int. Cl.
  *H05K 1/02*   (2006.01)
  *H05K 1/14*   (2006.01)

(52) U.S. Cl.
  CPC ........... *H05K 1/0209* (2013.01); *H05K 1/144* (2013.01); *H05K 2201/042* (2013.01); *H05K 2201/064* (2013.01)

(58) Field of Classification Search
  CPC ................. H05K 1/0209; H05K 1/144; H05K 2201/042; H05K 2201/064
  See application file for complete search history.

(56) References Cited

U.S. PATENT DOCUMENTS

| | | | |
|---|---|---|---|
| 5,870,823 A * | 2/1999 | Bezama | H01L 23/473 |
| | | | 174/15.1 |
| 6,665,185 B1 | 12/2003 | Kulik et al. | |
| 6,670,699 B2 * | 12/2003 | Mikubo | H05K 1/0272 |
| | | | 257/E23.09 |
| 8,363,402 B2 | 1/2013 | Brunschwiler et al. | |
| 10,699,986 B2 | 6/2020 | Kearney et al. | |
| 2006/0034052 A1 | 2/2006 | Chang et al. | |
| 2007/0045801 A1 | 3/2007 | Sugiyama et al. | |
| 2017/0325327 A1 | 11/2017 | Smith et al. | |
| 2022/0039252 A1 * | 2/2022 | Zhou | H05K 1/185 |
| 2023/0284377 A1 * | 9/2023 | Zhou | H05K 7/20927 |
| | | | 361/699 |

(Continued)

FOREIGN PATENT DOCUMENTS

| | | |
|---|---|---|
| CN | 107734840 A | 2/2018 |
| CN | 113286416 A | 8/2021 |
| EP | 1466513 B1 | 4/2013 |

OTHER PUBLICATIONS

R. v. Erp, G. Kampitsis, L. Nela, R. S. Ardebili and E. Matioli, "Embedded Microchannel Cooling for High Power-Density GaN-on-Si Power Integrated Circuits," 2020 19th IEEE Intersociety Conference on Thermal and Thermomechanical Phenomena in Electronic Systems (ITherm), 2020, pp. 53-59, doi: 10.1109/ITherm45881.2020.9190356.

(Continued)

*Primary Examiner* — Mukundbhai G Patel (57) ABSTRACT

A printed circuit board (PCB) assembly includes a first PCB including at least one heat generating component. A second PCB is mounted to the first PCB. The second PCB defines a cooling path therein extending in a coolant flow direction from an inlet end of the cooling path to an outlet end of the cooling path. A plurality of power pillars extend from the first PCB and across the cooling path.

12 Claims, 6 Drawing Sheets

(56) References Cited

U.S. PATENT DOCUMENTS

2023/0307406 A1* 9/2023 Zhou .................. H05K 7/20927

OTHER PUBLICATIONS

Bringing the Heat Sink Closer to the Heat: Evaluating Die-embedded Microchannel Cooling of GaN-on-Si Power Devices, Therminic 2020.

Co-designing electronics with microfluidics for more sustainable cooling Remco van Erp, Reza Soleimanzadeh, Luca Nela, Georgios Kampitsis & Elison Matioli Nature vol. 585, pp. 211-216 (2020).

F. Schindler-Saefkow, O. Wittler, D. May and B. Michel, "Thermal Management in a 3D-PCB-Package with Water Cooling," 2006 1st Electronic Systemintegration Technology Conference, 2006, pp. 107-110, doi: 10.1109/ESTC.2006.279986.

H. Yu, J. Gui, L. Yi, Y. Liu, L. Deng and C. Jiang, "Multilayer PCBs Embedded with Cooling Microchannels for High Power Electronic Devices in Wireless Systems," 2020 IEEE MTT-S International Wireless Symposium (IWS), 2020, pp. 1-3, doi: 10.1109/IWS49314.2020.9360067.

Bar-Cohen, A., Maurer, J.J., & Felbinger, J.G. (2013). DARPA's Intra/Interchip Enhanced Cooling (ICECool) Program.

J. Ditri et al., "GaN Unleashed: The Benefits of Microfluidic Cooling," in IEEE Transactions on Semiconductor Manufacturing, vol. 29, No. 4, pp. 376-383, Nov. 2016, doi: 10.1109/TSM.2016.2597363.

J. Schnur, A. B. Sharma, N. Haag, T. Kuwan, A. Stogel and T. Huesgen, "Design and Fabrication of PCB Embedded Power Module with Integrated Heat Exchanger for Dielectric Coolant," CIPS 2018; 10th International Conference on Integrated Power Electronics Systems, 2018, pp. 1-6.

W. W. Wits and T. H. J. Vaneker, "Integrated Design and Manufacturing of Flat Miniature Heat Pipes Using Printed Circuit Board Technology," in IEEE Transactions on Components and Packaging Technologies, vol. 33, No. 2, pp. 398-408, Jun. 2010, doi: 10.1109/TCAPT.2010.2041929.

D. Pounds and R. W. Bonner, "High heat flux heat pipes embedded in metal core printed circuit boards for LED thermal management," Fourteenth Intersociety Conference on Thermal and Thermomechanical Phenomena in Electronic Systems (ITherm), 2014, pp. 267-271, doi: 10.1109/ITHERM.2014.6892291.

R. B. Oueslati, D. Therriault and S. Martel, "PCB-Integrated Heat Exchanger for Cooling Electronics Using Microchannels Fabricated With the Direct-Write Method," in IEEE Transactions on Components and Packaging Technologies, vol. 31, No. 4, pp. 869-874, Dec. 2008, doi: 10.1109/TCAPT.2008.2004773.

Extended European Search Report dated Dec. 19, 2023, issued during the prosecution of European Patent Application No. EP 23184872.2.

* cited by examiner

PRINTED CIRCUIT BOARD (PCB) COOLING

STATEMENT REGARDING FEDERALLY SPONSORED RESEARCH OR DEVELOPMENT

This invention was made with government support under Contract No. DE-AR0001404 awarded by the U.S. Department of Energy. The U.S. government has certain rights in the invention.

BACKGROUND

1. Field

The present disclosure relates to printed circuit boards (PCBs), and more particularly to cooling for heat generating components connected to PCBs.

2. Description of Related Art

Conventional approaches for cooling power electronics on PCBs include non-direct cooling methods such as using a cold plate to cool a device embedded inside a PCB, mounting a cold plate for top cooling a power device that is surface mounted to a PCB, and mounting a cold plate to the opposite side of a PCB from a surface mounted power device. These approaches typically lead to a high temperature gradient between an inlet coolant and a junction temperature due to the thermal resistance of multiple intervening layers of material. This makes it difficult to maintain proper case or package temperature for heat generating power electronics devices, e.g., GaN (Gallium Nitride) transistors or the like.

Solutions to this problem typically use 3D printing or sintering to provide channels for microfluids. However, these solutions require special fabrication techniques not normally used for PCB manufacturing. They also present challenges for how to connect other sub-circuits and how to mount passive components. Embedded PCB designs and heat pipes embedded in PCBs are not easy to make in a way that provides acceptable thermal performance and that is suitable for high power electronics.

The conventional techniques have been considered satisfactory for their intended purpose. However, there is an ever-present need for improved systems and methods for cooling 5 PCBs. This disclosure provides a solution for this need.

SUMMARY

A printed circuit board (PCB) assembly includes a first PCB including at least one heat generating component. A second PCB is mounted to the first PCB. The second PCB defines a cooling path therein extending in a coolant flow direction from an inlet end of the cooling path to an outlet end of the cooling path. A plurality of power pillars extend from the first PCB and across the cooling path.

The plurality of power pillars can be parallel to one another and can extend in a direction perpendicular to the coolant flow direction. The plurality of power pillars can be arranged in a two dimensional array that is aligned inward from the at least one heat generating component. The plurality of power pillars can extend through the first PCB.

An inlet aperture can be defined through the first PCB at an inlet end of the first PCB and can be connected in fluid communication with the cooling path for ingress of coolant from an external source into the cooling path. An outlet aperture can be defined through the first PCB at an outlet end of the first PCB and can be connected in fluid communication with the cooling path for egress of coolant from the cooling path. An inlet fitting can be mounted to the inlet aperture and an outlet fitting can be mounted to the outlet aperture. The inlet and outlet fittings can be configured to connect to a coolant circulation system for circulation of coolant through the cooling path.

A third PCB can include at least one heat generating component. The third PCB can be mounted to the second PCB opposite from the first PCB. The cooling path can be enclosed between the first and third PCBs and a perimeter of the second PCB. The first and second PCBs can be adhered together with a laser cut adhesive. The second and third PCBs can be adhered together with a laser cut adhesive. The first PCB, second PCB, and third PCB can be joined together with fasteners passing through aligned fastener bores of the first PCB, second PCB, and third PCB. The fasteners can be in fluid isolation from the cooling path. The plurality of power pillars can extend through the first PCB, across the cooling path, and through the third PCB for conducting heat from the at least one heat generating component of the first PCB and from the at least one heat generating component of the third PCB into the cooling path.

The second PCB can be an assembly of a plurality of PCB elements including copper lining elements bounding the cooling path. A dielectric coolant can be used in the cooling passage insulating against electrical conduction between the plurality of power pillars.

The plurality of power pillars can be electrically insulated from the at least one heat generating component of the first PCT and from the at least one heat generating component of the third PCB. The plurality of power pillars can be polymer coated or can be ceramic.

At least some of the plurality of power pillars can be electrically conductive and can form part of circuitry electrically connecting the at least one heat generating component of the first PCB to the at least one heat generating component of the third PCB. The plurality of power pillars can be of copper or aluminum.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
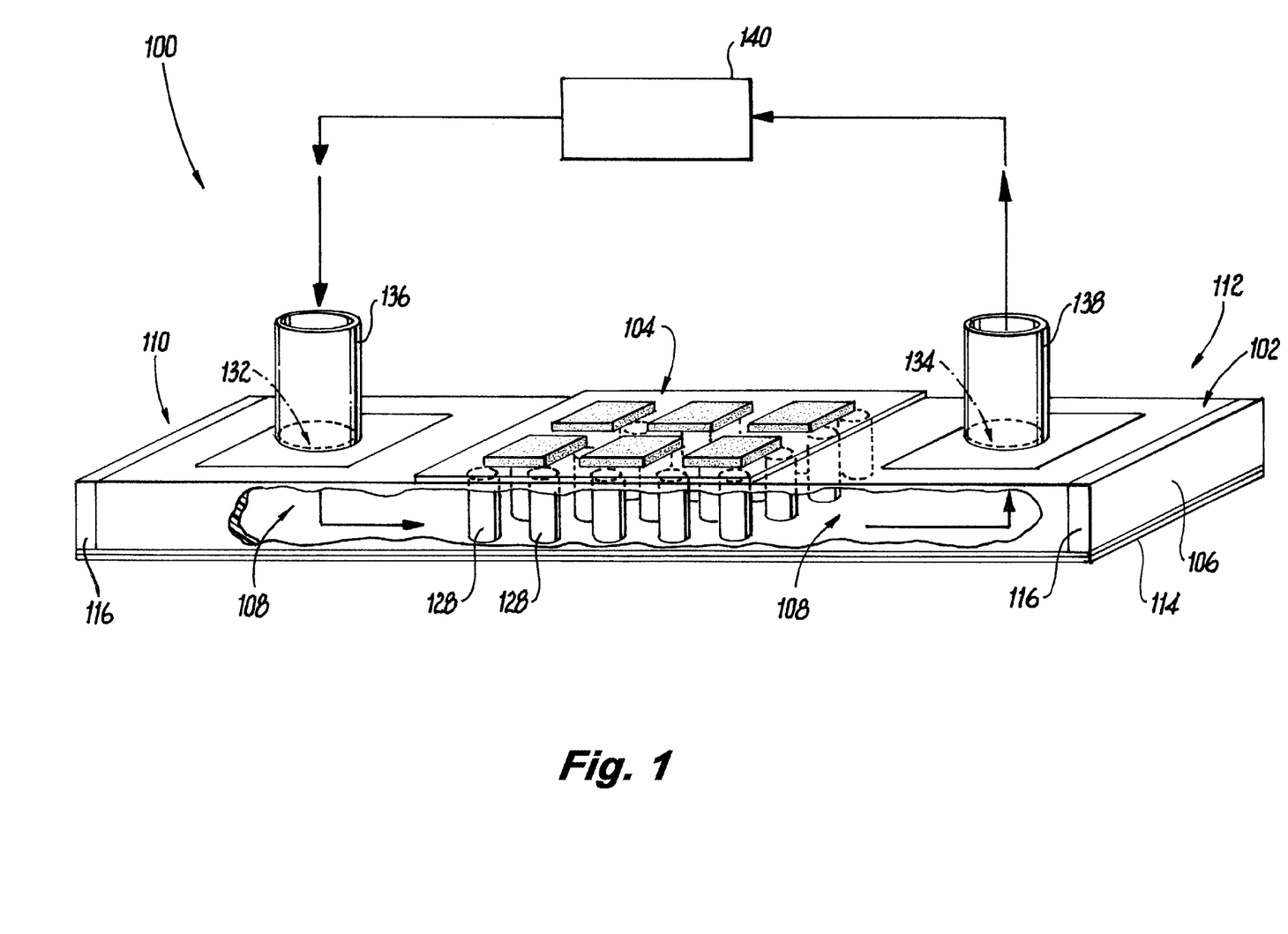
FIG. 1 is a schematic perspective view of an embodiment of a printed circuit board (PCB) assembly constructed in accordance with the present disclosure, showing the power pillars in the cooling path.

Reference will now be made to the drawings wherein like reference numerals identify similar structural features or aspects of the subject disclosure. For purposes of explanation and illustration, and not limitation, a partial view of an embodiment of a printed circuit board (PCB) in accordance with the disclosure is shown in FIG. 1 and is designated generally by reference character 100. Other embodiments of systems in accordance with the disclosure, or aspects thereof, are provided in FIGS. 2a-3, as will be described. The systems and methods described herein can be used to provide cooling of heat generating components included with PCBs.

The PCB assembly 100 includes a first PCB 102 including at least one heat generating component 104, e.g. GaN (Gallium Nitride) transistors or the like. A second PCB 106 is mounted to the first PCB 102. Herein, the second PCB 106 is referred to as a PCB even if there are no printed circuit traces on the PCB 106, but it can be made of a similar PCB material, e.g. FR4 material, to the first PCB 102. The second PCB 106 defines a cooling path 108 therein extending in a coolant flow direction (indicated in FIG. 1 by the large flow arrows) from an inlet end 110 of the cooling path 108 to an outlet end 112 of the cooling path 108. The second PCB 106 is an assembly of a plurality of PCB elements including copper lining elements 126 (labeled in FIG. 2a) on an e.g., FR4 or similar material of the perimeter 116, wherein the copper lining elements 126 bound the cooling path 108.

Figure 2A:
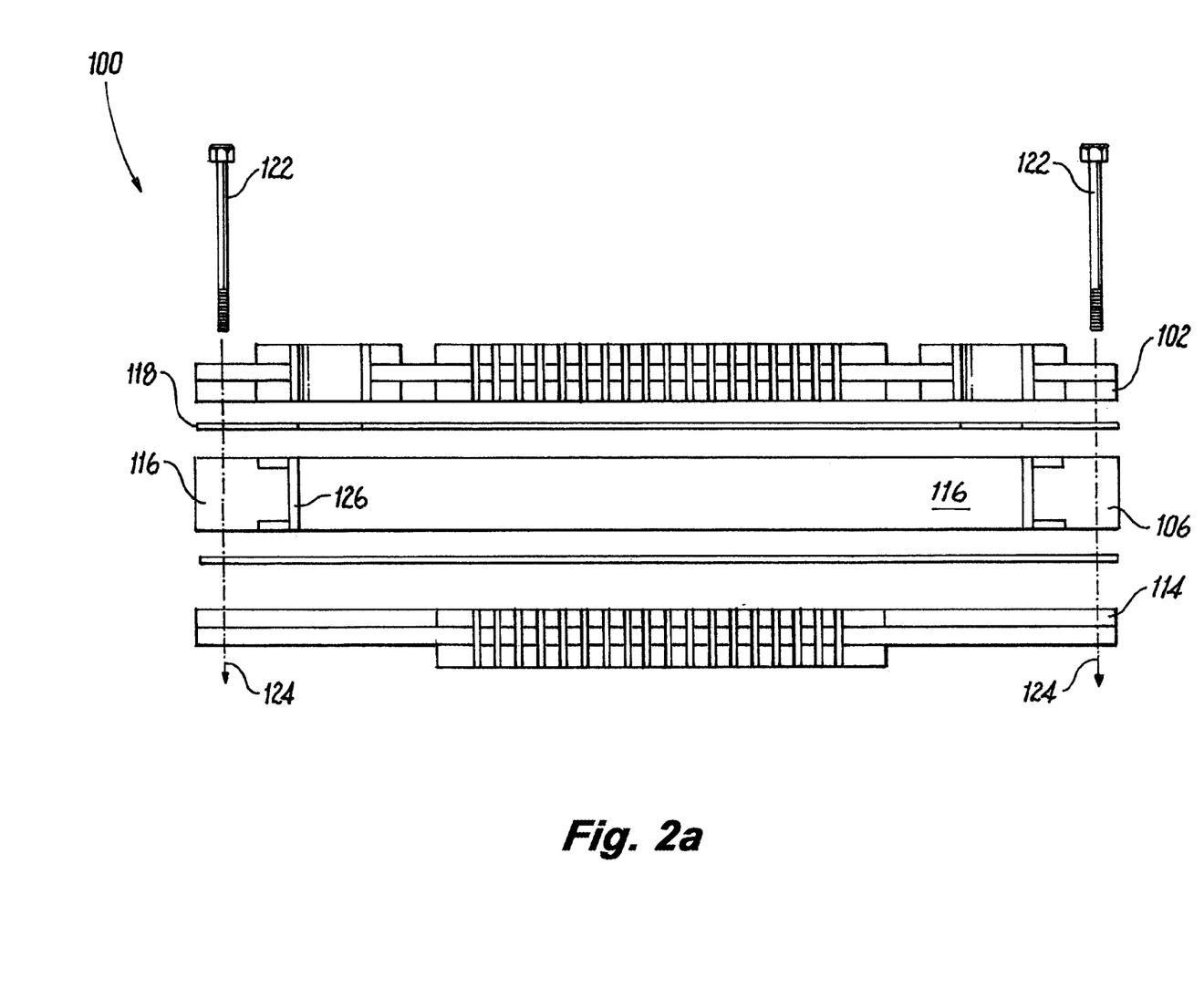
FIGS. 2a-2d are cross-sectional side elevation views of the PCB assembly of FIG. 1, showing four stages in a process of assembling the PCBs together.
Figure 2B:
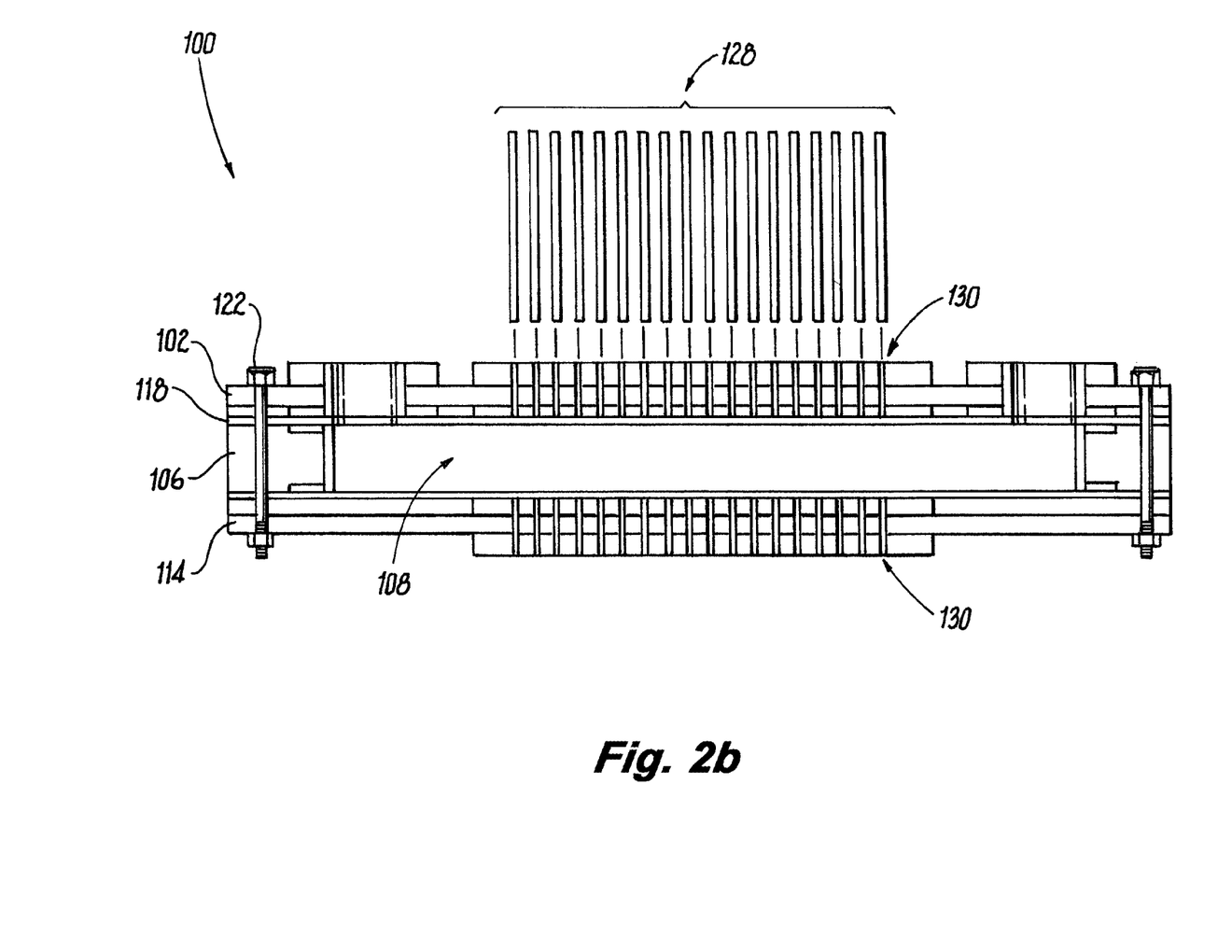
Figure 2C:
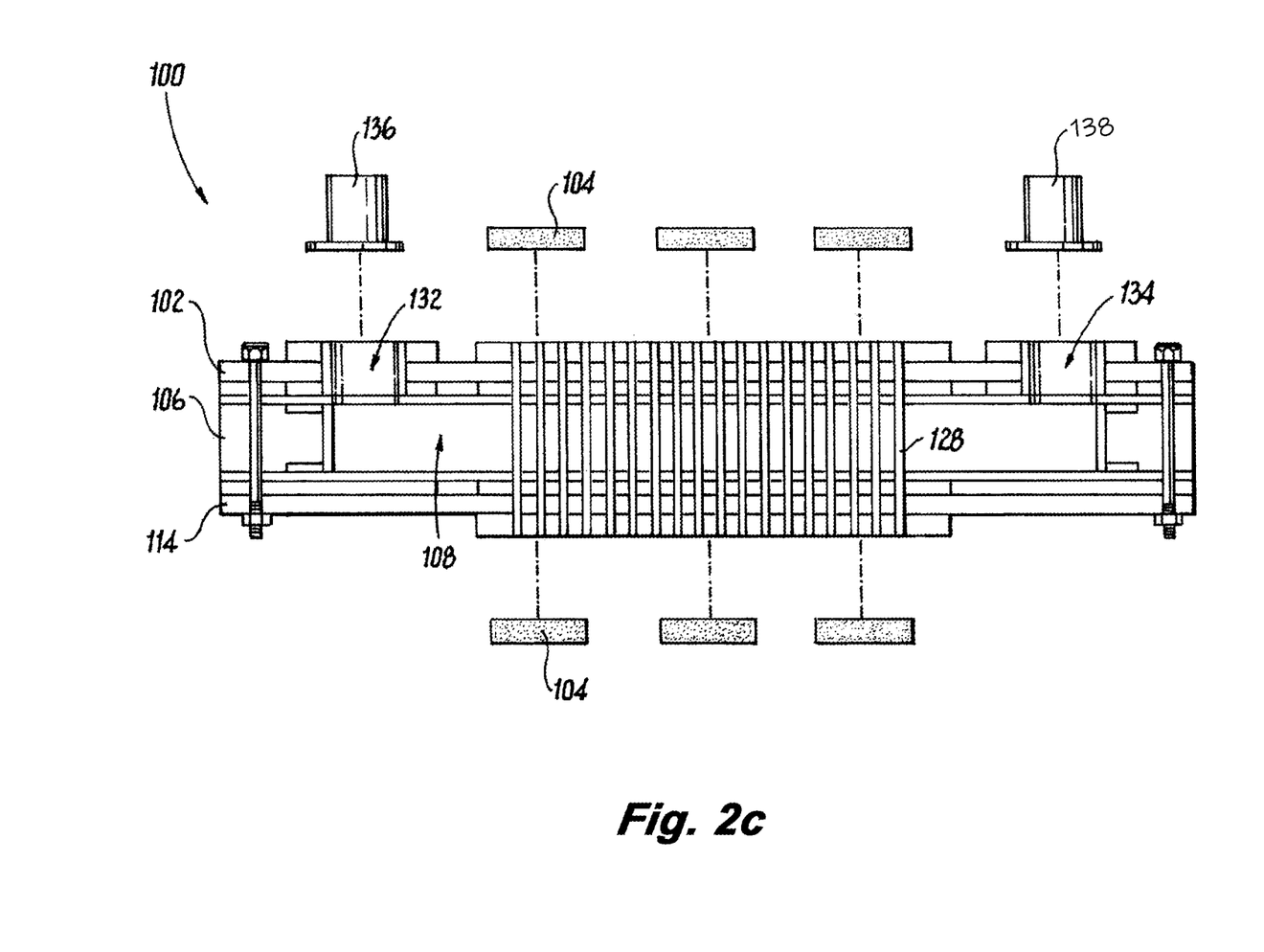
Figure 2D:
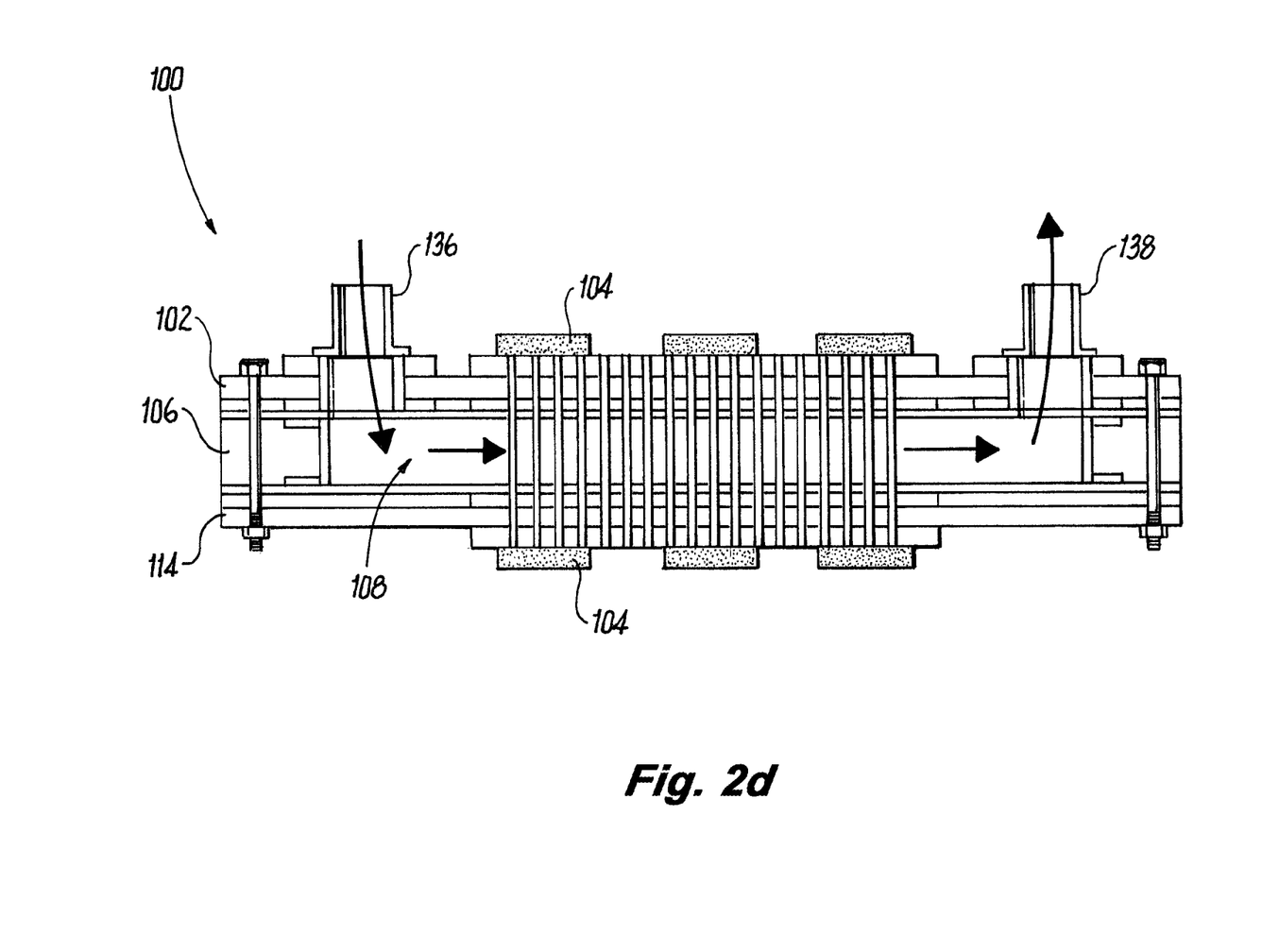

With continued reference to FIG. 1, a third PCB 114 optionally includes at least one heat generating component 104, not shown in FIG. 1, but see FIGS. 2c-2d. It is also possible for the third PCB 114 to be free of any heat generating components. The third PCB 114 is mounted to the second PCB 106 opposite from the first PCB 102. The cooling path 108 is enclosed between the first and third PCBs 102, 114 and a perimeter 116 of the second PCB 106.

With reference now to FIG. 2a, the first and second PCBs 102, 106 are adhered together with a laser cut adhesive 118. The second and third PCBs 106, 114 are adhered together with a laser cut adhesive 120. The laser cut adhesives 118, 120 form a fluid tight seal for coolant flowing through the cooling passage 108 (labeled in FIG. 2c). The first PCB 102, second PCB 106, and third PCB 114 are joined together with fasteners 122, passing through aligned fastener bores (schematically indicated in FIG. 2a with the bore lines 124) of the first, second, and third PCBs 102, 106, 114. As shown in FIG. 2b, when assembled, the fasteners 122 are in fluid isolation from the cooling path 108.

Referring again to FIG. 1, a plurality of power pillars 128 extend from the first PCB 102, across the cooling path 108, to the third PCB 114. As shown in FIG. 2b, after the fasteners 122 are have joined the PCBs 102, 106, 114, the power pillars 128 can be extended through respective bores 130 through the first PCB 102, across the cooling path 108 defied through the second PCB 106, and through respective bores 130 through the third PCB 114. Then as indicated in FIG. 2c, the heat generating components 104 can be mounted, e.g. by soldering, to the outer surface of the first and third PCBs 102, 114, as well as to the outer surface of the power pillars 128 for conducting heat from the at heat generating components 104 of the first and third PCBs 102, 114 into the cooling path 108. As shown schematically in FIG. 1, the power pillars 128 are parallel to one another and extend in a direction perpendicular to the coolant flow direction, i.e. the power pillars extend vertically across the cooling path 108 relative to the left to right direction of coolant flow as oriented in FIG. 1. The power pillars 128 are arranged in a two dimensional array that is aligned inward from the heat generating component 104, and coolant can flow through the array, going around the individual power pillars 128. The density (number) of power pillars in the array connected beneath the heat generating component 104 can be based on the expected amount of generated heat.

With reference again to FIGS. 1 and 2c, an inlet aperture 132 is defined through the first PCB 102 at the inlet end 110 of the first PCB 102, which is connected in fluid communication with the cooling path 108 for ingress of coolant from an external source into the cooling path 108. An outlet aperture 134 is defined through the first PCB 102 at an outlet end 112 of the first PCB 102 and is connected in fluid communication with the cooling path 108 for egress of coolant from the cooling path 108. An inlet fitting 136 is mounted, e.g. by soldering concurrent with soldering the heat generating components 104, to the inlet aperture 132. An outlet fitting 138 is similarly mounted to the outlet aperture 134. In this assembly process, there is no need for special assembly or fabrication processes beyond those normally used in multilayer PCB manufacturing. Those skilled in the art will readily appreciate that the either or both inlet aperture 132 and/or outlet aperture 134 can optionally be defined in the third PCB 114 instead of in the first PCB 102.

The inlet and outlet fittings 168, 138 are configured to connect to a coolant circulation system 140 for circulation of coolant through the cooling path 108. A dielectric coolant can be used in the cooling passage 108, insulating against electrical conduction between the power pillars 128. The power pillars 128 can be made of any suitable thermally conducting material that can be used in PCB fabrication processes. It is also contemplated that power pillars can be made of ceramic material in case electrically conducing cooling liquid is used. The PCB assembly can also support cryogenic coolant in the cooling passage 108.

The final PCB assembly 100 is shown in FIG. 2d, where the flow of coolant is indicated schematically with the large flow arrow. The power pillars 128 can be electrically insulated from the heat generating component 104, e.g. if the power pillars 128 are of copper or aluminum that is polymer coated, or if the power pillars 128 are of a heat conducting, electrically insulating ceramic material. It is also contemplated that at least one of the power pillars 128 can be electrically conductive and can form part of circuitry electrically connecting at least one heat generating component 104 of the first PCB 102 to at least one heat generating component 104 of the third PCB 114, e.g. for connecting heat generating components 104 in electrical parallel or series without needing additional vias. The power pillars 128 do not necessarily have to be connected to the heat generating elements on the third PCB 114. In some cases they can be connected to heat generating elements only on the first PCB 12 and are terminated on the third PCB 114 in empty space or some circuit trace if the power pillars 128 are being used for current transfer.

Figure 3:
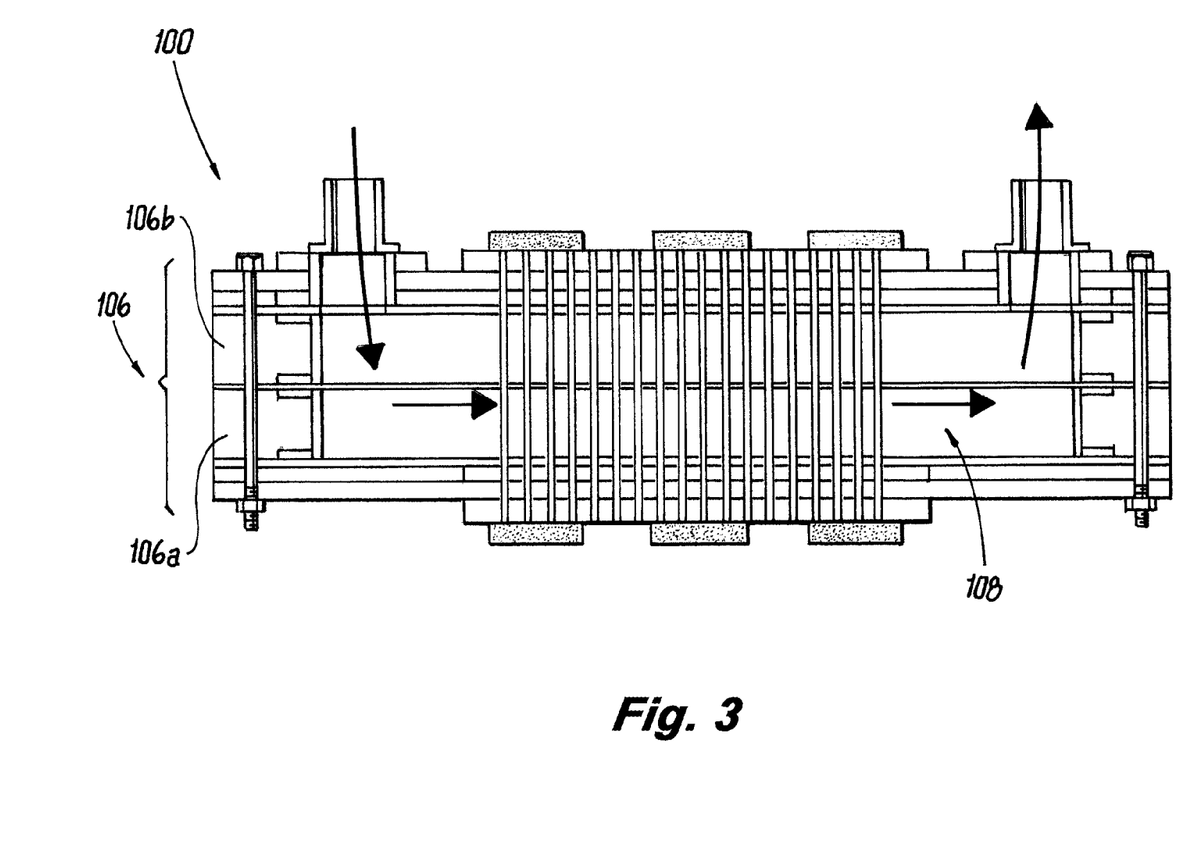
FIG. 3 is a cross-sectional view of the PCB assembly of FIG. 1, showing two individual PCB layers bounding the cooling path.

FIG. 3 shows an embodiment where the second PCB 106 is an assembly of two (or more if desired) sub-PCBs 106a, 106b stacked one on top of the other provide additional thickness in the cooling flow path 108. It is also contemplated that the second PCB 106 can be a single epoxy glass layer with no copper, e.g. eliminating the coper lining elements 126 labeled in FIG. 2a.

Potential benefits of systems and methods as disclosed herein include the following. There is no need for a cold plate. Multiple power pillars provide for improved heat transfer, for sharing power between multilayered PCBs, and for easily increasing power ratings with parallel devices. Any suitable type of heat generating devices can be used, whether bare die or COTS (commercial off the shelf) or the like. Both sides of the assembly provide area for printed circuits. There can be a higher power density, and better space utilization that in traditional assemblies.

The methods and systems of the present disclosure, as described above and shown in the drawings, provide for cooling of heat generating components included with PCBs. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A printed circuit board (PCB) assembly comprising:
   a first PCB including at least one heat generating component;
   a second PCB mounted to the first PCB, wherein the second PCB defines a cooling path therein extending in a coolant flow direction from an inlet end of the cooling path to an outlet end of the cooling path;
   a plurality of power pillars extending from the first PCB and across the cooling path; and
   a third PCB, wherein the third PCB is mounted to the second PCB opposite from the first PCB, wherein the cooling path is enclosed between the first and third PCBs and a perimeter of the second PCB.

2. The assembly as recited in claim 1, wherein the first PCB, second PCB, and third PCB are joined together with fasteners passing through aligned fastener bores of the first PCB, second PCB, and third PCB, wherein the fasteners are in fluid isolation from the cooling path.

3. The assembly as recited in claim 1, wherein the power pillars extend through the first PCB, across the cooling path, and through the third PCB for conducting heat from the at least one heat generating component of the first PCB and from at least one heat generating component of the third PCB into the cooling path.

4. The assembly as recited in claim 3, wherein the power pillars are electrically insulated from the at least one heat generating component of the first PCB and from the at least one heat generating component of the third PCB.

5. The assembly as recited in claim 4, wherein the power pillars are polymer coated.

6. The assembly as recited in claim 4, wherein the power pillars are ceramic.

7. The assembly as recited in claim 4, further comprising a dielectric coolant in the cooling path insulating against electrical conduction between the power pillars.

8. The assembly as recited in claim 3, wherein at least some of the power pillars are electrically conductive and form part of circuitry electrically connecting the at least one heat generating component of the first PCB to the at least one heat generating component of the third PCB.

9. The assembly as recited in claim 8, wherein the power pillars are copper.

10. The assembly as recited in claim 8, wherein the power pillars are aluminum.

11. The assembly as recited in claim 8, further comprising a dielectric coolant in the cooling path.

12. The assembly as recited in claim 1, wherein the second PCB is an assembly of a plurality of PCB elements including copper-lining elements bounding the cooling path.

\* \* \* \* \*